Sept. 7, 1965 R. A. PACL, JR 3,205,372

SCHMITT TRIGGER CIRCUIT CHARACTERIZED BY NOISE IN SENSITIVITY

Filed Aug. 2, 1962

INVENTOR
ROBERT A. PACL JR.

BY William E. Cleaver

ATTORNEY

United States Patent Office 3,205,372
Patented Sept. 7, 1965

3,205,372

SCHMITT TRIGGER CIRCUIT CHARACTERIZED BY NOISE INSENSITIVITY

Robert A. Pacl, Jr., Willow Grove, Pa., assignor to Sperry Rand Corporation, New York, N.Y., a corporation of Delaware Filed Aug. 2, 1962, Ser. No. 214,384
2 Claims. (Cl. 307—88.5)

This invention relates to switching circuits and more particularly to a trigger circuit which is relatively insensitive to input signal noise.

With certain switching circuits, such as a Schmitt trigger, the circuit has two conducting elements and is transferred from one state of conduction to another (i.e., one element conducts in a first state of conduction and the other element conducts in a second state of conduction) for as long a period of time as an applied input signal remains above (or in the alternative, below) a certain threshold level. If a noise signal is superimposed upon the input signal which is causing the circuit to be transferred from a first state of conduction to a second state of conduction, there is a tendency to have such a trigger circuit spuriously revert back to the first state of conduction. Obviously a trigger circuit which is sensitive to noise in this fashion is undesirable.

Accordingly it is an object of the present invention to provide an improved trigger circuit.

It is a further object of the present invention to provide a trigger circuit which is relatively insensitive to noise signals which are superimposed upon an input signal.

The present invention may be advantageously employed with a trigger circuit having first and second current conducting devices, wherein the control element of the second current conducting device is connected to the output element of the first current conducting device, such that when the first current conducting device is conducting the second current conducting device is rendered non-conducting and vice versa. In accordance with a feature of the present invention there is provided a first impedance element connected to the output element of the first current conducting device and a second impedance element, having a lesser value than said first impedance element, connected to the output element of the second current conducting device. By providing said first and second impedance with different values, as just described, the circuit determines that (in a first state of conduction) the current flowing through the first current conducting device will be of a lesser value than the current flowing (in a second state of conduction) through the second current conducting device.

In accordance with another feature of the present invention there is provided a transient voltage developing means connected to the input elements of both said first and said second current conducting devices such that in response to a change from one state of conduction to the other state of conduction there is initially developed across said transient voltage developing means a relatively large voltage having a polarity opposite to the slope of the applied signal. The development of said voltage prevents said circuit from spuriously returning to the state of conduction from whence it is being changed if noise signals are superimposed upon said input signal.

The above mentioned and other features and objects of this invention will become more apparent by reference to the following description taken in conjunction with the accompanying drawings wherein.

Figure 1:
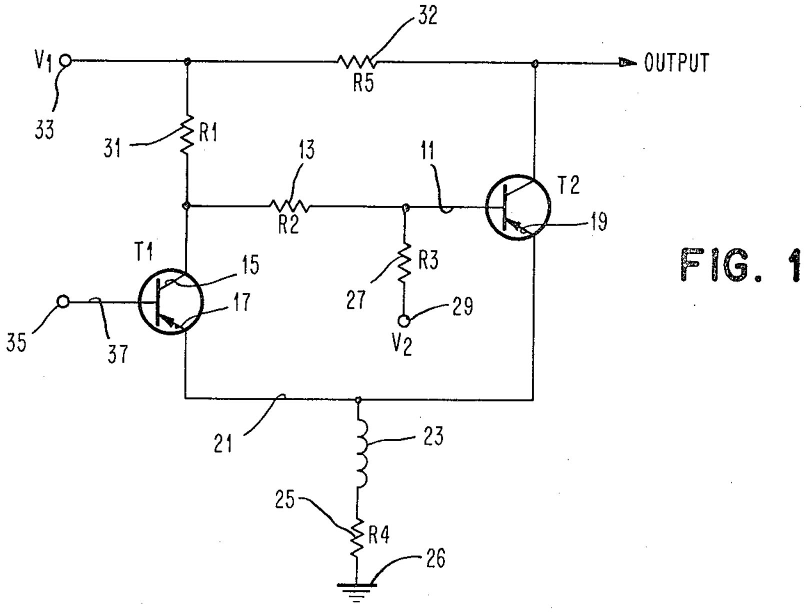
FIGURE 1 is a schematic of the improved trigger circuit.

Consider FIGURE 1 wherein there is shown a schematic of a Schmitt trigger. The Schmitt trigger shown in FIGURE 1 employs two PNP transistors, T1 and T2. The base 11 of T2 is connected to the resistor 13 and to the collector 15 of transistor T1. The emitter 17 of transistor T1 is common-connected to the emitter 19 of transistor T2. The common connection 21 of emitter 17 and emitter 19 is connected to ground through the inductance 23 and the resistor 25. Connected to the base 11 is a biasing resistor 27 whose other terminal is connected to the positive voltage source 29. Connected to the collector 15 of transistor T1 is a resistor 31 whose other terminal is connected to a minus voltage source 33. The resistors 31, 13 and 27 are connected together betwen the minus voltage source 33 and the positive voltage source 29 to provide a voltage divider network to bias the transistor T2 for conduction and non-conduction in response to the input signal applied to terminal 35, as will become more apparent hereinafter.

When a sufficiently negative input signal referred to the emitter of T1 is applied to the input terminal 35 which is connected to the base 37 of transistor T1, the transistor T1 is turned on and current conducts from the ground reference potential 26, through the resistor 25, through the inductance 23, through the transistor T1, through resistor 31, to the negative potential source 33. During the steady state condition (while transistor T1 is conducting), the collector 15 assumes a potential relatively close to ground and therefore the base 11 of transistor T2 which is connected to the positive potential side of resistor 13 is relatively positive and keeps the transistor T2 from conducting. As long as the transistor T1 is held in the steady state of conduction by an applied negative signal, the transistor T2 will remain in a cut-off condition.

When a sufficiently positive input signal as referred to the emitter of T1 is applied to the terminal 35, the transistor T1 is cut off and the voltage divider network consisting of the resistors 31, 13 and 27 (which is connected between the minus potential source 33 and the positive potential source 29) provides a negative potential to the base 11 of transistor T2 thereby turning on transistor T2. As long as transistor T1 remains non-conducting transistor T2 will conduct.

In the first state of conduction, when T1 is conducting there is a current I1 flowing therethrough and in the second state of conduction, when T2 is conducting, there is a current I2 flowing therethrough. Because the resistor 31 is larger than the output resistor 32 and is connected in series with the transistor T1, the current I1 is less than the current I2 and this difference in current values aids in the operation of the embodiment of FIGURE 1, as will be further discussed.

Consider now what happens, initially, when the Schmitt trigger of FIGURE 1 is transferred from T1 conducting to T2 conducting (from the first state of conduction to the second state of conduction). When the transistor T1 is conducting the smaller of the two currents, I1, is passing in a steady rate through the resistor 25 and through the inductance 23. When the positive signal is applied to the base 37 and the transistor T1 is cut off, the transistor T2 is turned on, as described before, and a larger current I2 is required to pass through the resistor 25 and the inductance 23. This initial surge of increased current sees the inductance 23 as a high impedance and therefore a voltage drop is developed thereacross causing the common connector 21 to go relatively negative as compared with its voltage value in the first state of conduction. This can be clearly seen in FIGURE 2 which is a graphic description of the signal relationships.

Figure 2:
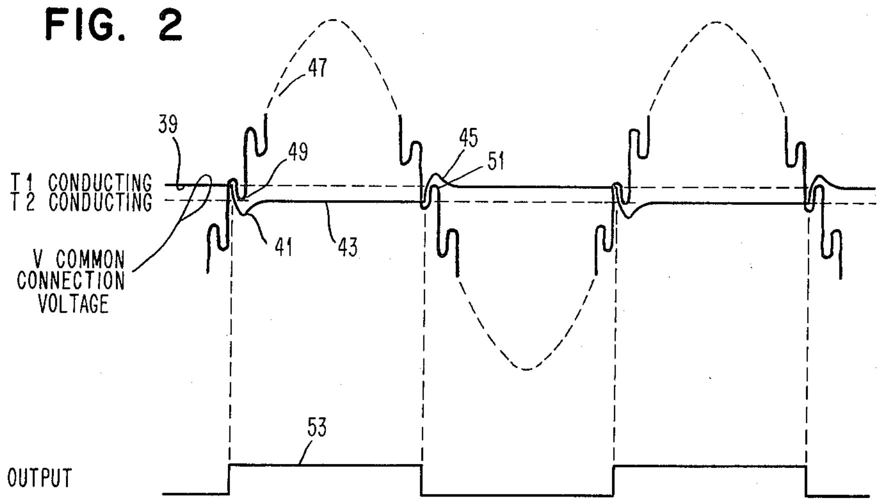
FIGURE 2 is the graphic display showing the relationship between an input signal, the emitter voltage and the output signal.

In FIGURE 2 the voltage at the common connection when TR1 is conducting (the first state of conduction) is shown at 39. As T1 is cut off and there is the surge of additional current to provide the I2 current, the negative voltage developed across the inductance 23 is shown in the graph as the voltage shift 41. As the second steady state condition is approached, with transistor T2 conducting, the voltage at the common connection 21 becomes more positive and assumes the level 43 shown in FIGURE 2. It will be noted that the voltage level 43 is somewhat more negative than the voltage level 39 and this is due to the increased current across the resistor 25.

When the Schmitt trigger transfers from the second state of conduction, i.e. T2 conducting, to the first state of conduction i.e., T1 conducting, in response to a negative input signal being applied to input terminal 35, the current conducting through resistor 25 and inductance 23 is changed from I2 to I1, which represents a reduction in current. As the current switches from T2 conducting to T1 conducting and the lesser current I1 is required, the inductance 23 attempts to resist the change and thereby provides a relatively positive potential at the common connection 21. This phenomenum is depicted in FIGURE 2 by the voltage shift 45 indicating that the common connection 21 has a voltage change in the positive direction.

Examining now FIGURE 2 more closely it can be seen that the input signal 47 has a slope from a negative to a positive value which initially cuts the transistor T1 off. If there are noise signals superimposed upon the input and instantaneously there is a return to a negative voltage condition as shown by the superimposed noise 49, such a voltage shift will not spuriously trigger the transistor T1 into conduction again, because the common connection 21 or the emitter 17 is at the voltage level 41 which is more negative than the noise 49. In a similar operation as input signal 47 has a slope from a positive condition to a negative condition and crosses the threshold to turn on transistor T1, the emitter 17 has a voltage shift 45 to a positive value shown. Therefore if the noise signal superimposed upon the input signal should return to a positive value such as at the level 51, the transistor T1 will not be spuriously turned off once again because the common connection 21 is now at a more positive level than noise level 51. It becomes clear then that the Schmitt trigger shown in FIGURE 1 is insensitive to noise being superimposed upon an input signal which is one of the main objectives of the present invention. Also shown in FIGURE 2 is the graphic relationship between the output signal 53 and the input signal 47. Obviously the output signal could be taken from other points.

While I have described above the principles of my invention in connection with specific apparatus, it is to be clearly understood that this description is made only by way of example, and not as a limitation of the scope of my invention, as set forth in the objects thereof, and in the accompanying claims.

The embodiments of the invention in which an exclusive property or privilege is claimed are defined as follows:

1. A trigger circuit comprising:

(a) first and second current conducting devices, each current conducting device having an input element, a control element and an output element;

(b) common connection means conductively coupling said input elements of said first and second current conducting devices;

(c) voltage divider means intercoupling said control element of said second current conducting device with said output element of said first current conducting device such that said second current conducting device conducts when said first current conducting device is non-conducting and such that said second current conducting device is rendered non-conducting when said first current conducting device is conducting;

(d) first resistor means connected to the output element of said first current conducting device;

(e) second resistor means having a lesser value than said first resistor means connected to the output element of said second current conducting device thereby determining that the value of the first current flowing through said first current conducting device is not as great as the value of the second current flowing through said second current conducting device;

(f) inductive voltage developing means connected to said common connection and responsive to said first and second currents respectively flowing in said first and second current conducting devices such that when an input signal is applied to said first current conducting device to change the state of conduction thereof the initial voltage developed across said transient voltage developing means and applied to said common connection renders said input elements at a voltage polarity and a voltage value which prevents said first current conducting device from spuriously returning to the state of conduction from whence it is being changed, in response to noise signals less than a predetermined level superimposed upon said input signal.

2. A trigger circuit comprising:

(a) first and second transistors each having an emitter element, a base element and a collector element;

(b) common connection means conductively coupling said emitter element of said first and second electron conducting devices;

(c) voltage divider means intercoupling said base element of said second transistor with said collector element of said first transistor such that said second transistor conducts when said first transistor is non-conducting and such that said second transistor is rendered non-conducting when said first transistor is conducting;

(d) first resistor means connected to the collector element of said first transistor;

(e) second resistor means having a lesser value than said first resistor means connected to the collector element of said second transistor thereby determining that the value of the first current flowing through said first transistor is not as great as the value of the second current flowing through said second transistor;

(f) inductive voltage developing means connected to said common connection and responsive to said first and second currents respectively flowing in said first and second transistors such that when an input signal is applied to said first transistor to change the state of conduction thereof the initial voltage developed across said transient voltage developing means and applied to said common connection renders said emitter elements at a voltage polarity and a voltage value which prevents said first transistor from spuriously returning to the state of conduction from whence it is being changed in response to noise signals less than a predetermined level superimposed upon said input signal.

References Cited by the Examiner

UNITED STATES PATENTS

| | | | |
|---|---|---|---|
| 2,722,602 | 11/55 | Pawley | 328—203 |
| 2,860,259 | 11/58 | Odell et al. | 307—88.5 |
| 2,967,953 | 1/61 | Pribble | 328—203 |
| 2,992,640 | 7/61 | Knapp | 307—88.5 |
| 3,013,159 | 12/61 | De Sautels | 307—88.5 |
| 3,050,642 | 8/62 | Rogers et al. | 307—88.5 |
| 3,072,801 | 1/63 | Dahlberg | 307—88.5 |
| 3,109,945 | 11/63 | Riley | 307—88.5 |

FOREIGN PATENTS

| | | |
|---|---|---|
| 840,786 | 7/60 | Great Britain. |

DAVID J. GALVIN, *Primary Examiner.*

JOHN W. HUCKERT, *Examiner.*